(12) United States Patent
Chen

(10) Patent No.: US 7,834,436 B2
(45) Date of Patent: Nov. 16, 2010

(54) SEMICONDUCTOR CHIP PACKAGE

(75) Inventor: Nan-Jang Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/266,601

(22) Filed: Nov. 7, 2008

(65) Prior Publication Data

US 2009/0236706 A1 Sep. 24, 2009

Related U.S. Application Data

(63) Continuation-in-part of application No. 12/050,210, filed on Mar. 18, 2008.

(51) Int. Cl.
*H01L 23/495* (2006.01)
(52) U.S. Cl. .................. 257/676; 257/666; 257/675; 257/706; 257/707; 257/E23.004; 257/E23.031; 257/E23.043; 257/E23.046; 257/E23.052; 438/123; 438/380
(58) Field of Classification Search .................. 257/676, 257/666, E23.004, E23.031, E23.043, E23.046, 257/675, 706, 707; 438/E23.052, 380, 123
See application file for complete search history.

(56) References Cited

U.S. PATENT DOCUMENTS

| | | | |
|---|---|---|---|
| 5,389,816 A | 2/1995 | Shimizu et al. | |
| 5,789,811 A | 8/1998 | Chia et al. | |
| 5,818,105 A | 10/1998 | Kouda | |
| 5,920,116 A | 7/1999 | Umehara | |
| 5,933,710 A | 8/1999 | Chia et al. | |
| 6,724,071 B2 * | 4/2004 | Combs | 257/666 |
| 2005/0093118 A1 * | 5/2005 | Itou et al. | 257/676 |
| 2008/0303124 A1 | 12/2008 | Khan et al. | |

FOREIGN PATENT DOCUMENTS

CN 2585407 11/2003

OTHER PUBLICATIONS

Cited in Office Action mailed Apr. 14, 2010 in U.S. Appl. No. 12/050,210.
English language translation of abstract of CN 2585407 (published Nov. 5, 2003).

* cited by examiner

*Primary Examiner*—Long K Tran
(74) *Attorney, Agent, or Firm*—Thomas, Kayden, Horstemeyer & Risley

(57) ABSTRACT

An image processing system including an image processing device and a service providing device is provided. The image processing device includes a first processor and a first memory storing instructions that cause the image processing device to obtain parameters for receiving the service from the service providing device, request the service providing device to provide the service and implement a first or second function of the image processing device based on the parameters obtained from the parameter specifying unit. The service providing device includes a second processor and a second memory storing instructions that cause the service providing device to execute a service function to provide the service to the image processing device after receiving a request for the service from the image processing device.

12 Claims, 16 Drawing Sheets

_US 7,834,436 B2_

SEMICONDUCTOR CHIP PACKAGE

CROSS REFERENCE TO RELATED APPLICATIONS

This application is a Continuation-In-Part of application Ser. No. 12/050,210, filed Mar. 18, 2008.

BACKGROUND OF THE INVENTION

1. Field of the Invention

The present invention relates to a semiconductor chip package, and more particularly, relates to a semiconductor chip package with an increased amount of input/output connections.

2. Description of the Related Art

For semiconductor chip package design, an increased amount of input/output connections for multi-functional chips is required. For a conventional lead frame based semiconductor package, however, the amount of leads for input/output connections of a semiconductor chip are limited. To solve the aforementioned problem, a ball grid array (BGA) semiconductor package has been developed to provide a greater amount of input/output connections through solder balls on the bottom of a package substrate of the semiconductor chip package. Requirements for increased input/output connections can be achieved through a finer ball pitch. Compared with the conventional lead frame based semiconductor package, however, the BGA semiconductor package suffers from poorer yields and higher fabricating costs due to the additional electrical connections to the solder balls.

A novel semiconductor chip package with an increased amount of input/output connections and fabricating cost between the fabricating cost for lead frame and BGA semiconductor packages is desirable.

BRIEF SUMMARY OF INVENTION

A semiconductor chip package is provided. An exemplary embodiment of the semiconductor chip package comprises a lead frame having a chip carrier, wherein the chip carrier has a first surface and an opposite second surface. A semiconductor chip is mounted on the first surface, having a plurality of bonding pads thereon, wherein the semiconductor chip has an area larger than that of the chip carrier. A package substrate comprising a central region is attached to the second surface, has an area larger than that of the semiconductor chip, wherein some of the bonding pads of the semiconductor chip are electrically connected to a marginal region of the package substrate.

Another exemplary embodiment of the semiconductor chip package comprises a lead frame having a chip carrier. A semiconductor chip is mounted on a side of the chip carrier, having a plurality of bonding pads thereon, wherein the semiconductor chip has an area larger than that of the chip carrier. A package substrate is attached on an opposite side of the chip carrier, having an area larger than that of the semiconductor chip, wherein some of the bonding pads of the semiconductor chip are electrically connected to a top surface of the package substrate, which faces the chip carrier.

Yet another exemplary embodiment of the semiconductor chip package comprises a lead frame having a chip carrier and leads. A semiconductor chip is mounted on one side of the chip carrier, having a plurality of bonding pads thereon. A package substrate has a top surface is attached on an opposite side of the chip carrier, wherein the chip carrier has an area smaller than that of the semiconductor chip and the package substrate. Some of the bonding pads are electrically connected to the top surface of the package substrate, and the remaining bonding pads are electrically connected to the leads, respectively.

Yet another exemplary embodiment of the semiconductor chip package comprises a lead frame having a chip carrier, wherein the chip carrier has a first surface and an opposite second surface. A first semiconductor chip is mounted on the first surface, having a plurality of bonding pads thereon, wherein the first semiconductor chip has an area larger that that of the chip carrier. A package substrate has a central region attached to the second surface of the chip carrier, having an area larger than that of the first semiconductor chip, wherein the package substrate comprises a plurality of fingers on a top surface thereof in a marginal region of the package substrate, which are arranged in an array with a row of inner fingers adjacent to the first semiconductor chip and a row of outer fingers adjacent to an edge of the package substrate, wherein the inner fingers are electrically connected to the bonding pads of the first semiconductor chip, and the outer fingers are electrically connected to the lead frame.

Yet another exemplary embodiment of the semiconductor chip package comprises a package substrate comprising a central region and a marginal region. A first semiconductor chip comprising a plurality of bonding pads thereon is mounted on a top surface in the central region of the package substrate, having an area smaller than that of the package substrate. A lead frame without a chip carrier mounted is on top surface of the package substrate. A heat sink having a cavity is mounted on the top surface of the package substrate to accommodated the first semiconductor chip, an inner portion of the lead frame and a portion of the package substrate therein.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4b illustrates an enlarged view of a portion of FIG. 4a.

FIG. 5b to FIG. 5f are enlarged views of portions of FIG. 5a.

FIG. 9b shows a cross section along line A-A' of FIG. 9a.

DETAILED DESCRIPTION OF INVENTION

Figure 1A:
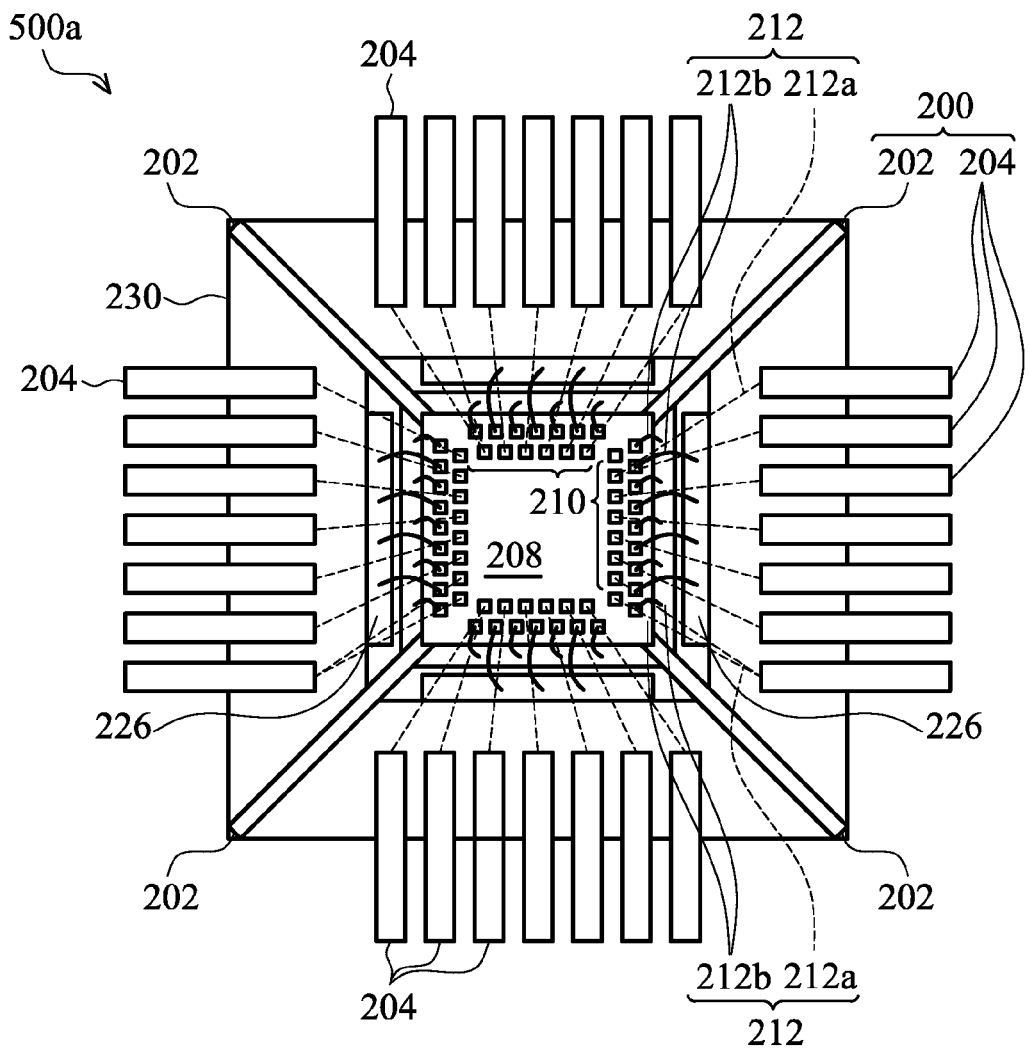
FIG. 1a shows a top view of one exemplary embodiment of a semiconductor chip package of the invention.

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

Figure 1B:
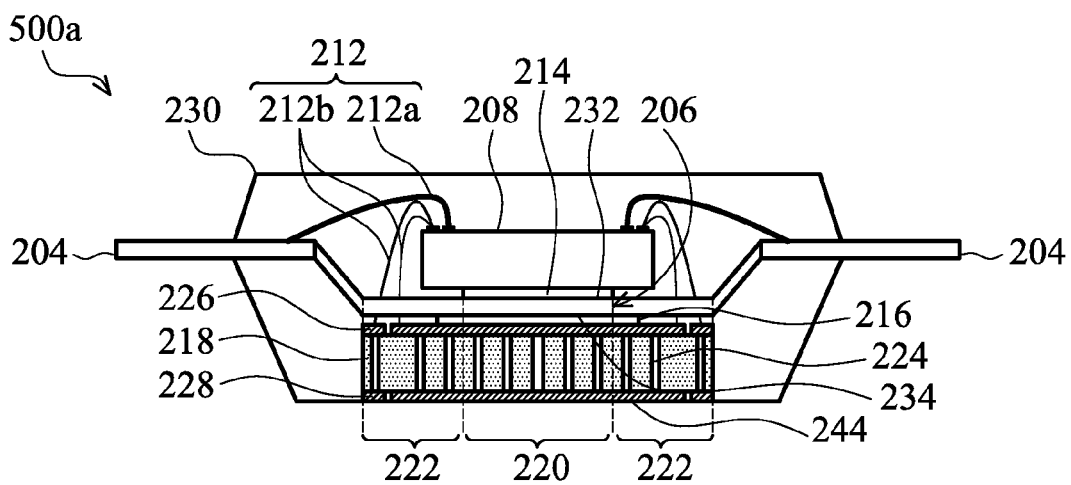
FIG. 1b shows a cross section of one exemplary embodiment of a semiconductor chip package of the invention.
Figure 2:
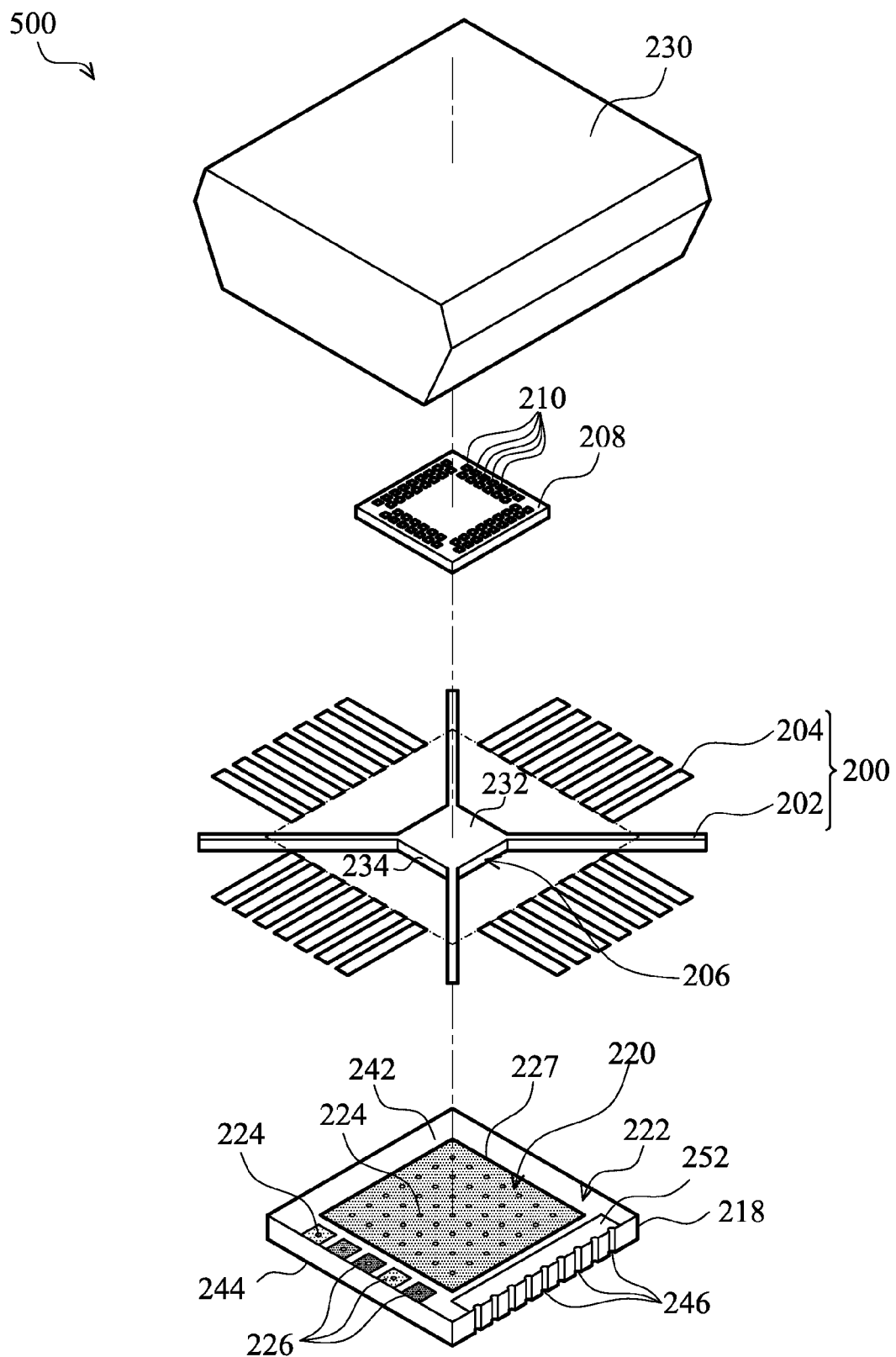
FIG. 2 shows an assembly diagram of an exemplary embodiment of a semiconductor chip package of the invention.

In accordance with an embodiment of the present invention, embodiments of a semiconductor chip package are provided. FIGS. 1a and 1b show one exemplary embodiment of the semiconductor chip package 500 of the invention. FIG. 2 shows an assembly diagram of an exemplary embodiment of the semiconductor chip package 500. In one embodiment of the invention, semiconductor chip package 500 may comprise a low-profile quad flat package (LQFP). Semiconductor chip package 500 comprises a lead frame 200 comprising a plurality of discrete leads 204, supporting bonds 202 and a chip carrier 206. Chip carrier 206 is disposed in a central portion of lead frame 200, electrically connecting to supporting bonds 202. Chip carrier 206 has a first surface 232 and an opposite second surface 234.

A semiconductor chip 208 is mounted on the first surface 232 by an adhesive material 214. Semiconductor chip 208 has a plurality of bonding pads 210 thereon. In one embodiment of the invention, the bonding pads 210 may be positioned to adjacent edges of the semiconductor chip 208 as shown in FIG. 1a. As shown in FIGS. 1a and 1b, the semiconductor chip 208 may have an area larger than that of the chip carrier 206.

A package substrate 218 comprises a central region 220 and a marginal region 222, wherein central region 220 is attached to a second surface 234 of the chip carrier 206 by an adhesive material 216, leaving the marginal region 222 exposed through the chip carrier 206. In one embodiment of the invention, the package substrate 218 may comprise a ball grid array (BGA) substrate. The package substrate 218 has a top surface 242 and a bottom surface 244, wherein the top surface 242 faces a second surface 234 of the chip carrier 206. In one embodiment of the invention, package substrate 218 may have an area larger than that of the semiconductor chip 208. A plurality of conductive planes 226, 227 and 252 may be formed on the top surface 242 in the marginal region 222, and a conductive plane 227 may be formed on the top surface 242 in the central region 220. A plurality of vias 224 are drilled through the package substrate 218, wherein some of the vias 224 are electrically connected to conductive planes 226, 227 and 252. The semiconductor chip package 500 may further comprise recesses 246 at an edge of the package substrate 218, through the package substrate 218. The recesses 246 may be positioned in the conductive plane 252. As shown in FIG. 1b, a plurality of ball pads 228 on a bottom surface 244 of the package substrate 218, is electrically connected to the vias 224. In one embodiment of the invention, each of conductive planes 226, 227 and 252 may be electrically connected to the corresponding ball pad 228 through vias 224, respectively. The semiconductor chip package 500 may further comprise solder balls (not shown) formed on the ball pads 228 to provide interconnection to an underlying printed circuit board (PCB) (not shown) of a final product.

As shown in FIGS. 1a and 1b, some of the bonding pads 210, for example, bonding pads 210 positioned adjacent to edges of the semiconductor chip 208, are electrically connected to conductive planes 226 in the marginal region 222 of the package substrate 218 by bonding wires 212a, respectively. And the remaining bonding pads 210, for example, bonding pads 210 positioned away from the semiconductor chip 208, are electrically connected to the leads 204 by bonding wires 212a, respectively. For electrical connections of bonding wires 212b between the semiconductor chip 208 and the package substrate 218, chip carrier 206 may have an area smaller than that of the semiconductor chip 208 and the package substrate 218, and the package substrate 218 may have an area larger than that of the semiconductor chip 208. A covering material 230 may encapsulate the semiconductor chip 208, an inner portion of lead frame 200 and a portion of the package substrate 218 by such as mold filling, leaving the bottom surface 244 of the package substrate 218 exposed from the covering material 230.

Figure 3A:
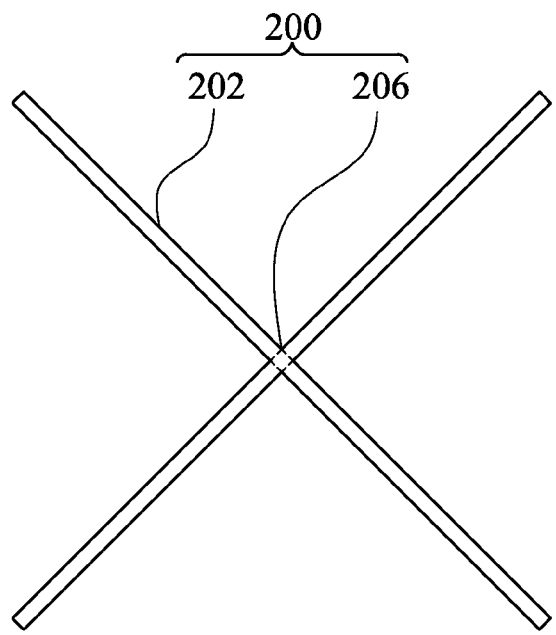
FIG. 3a to FIG. 3e are lead frames showing various designs of the chip carrier.
Figure 3B:
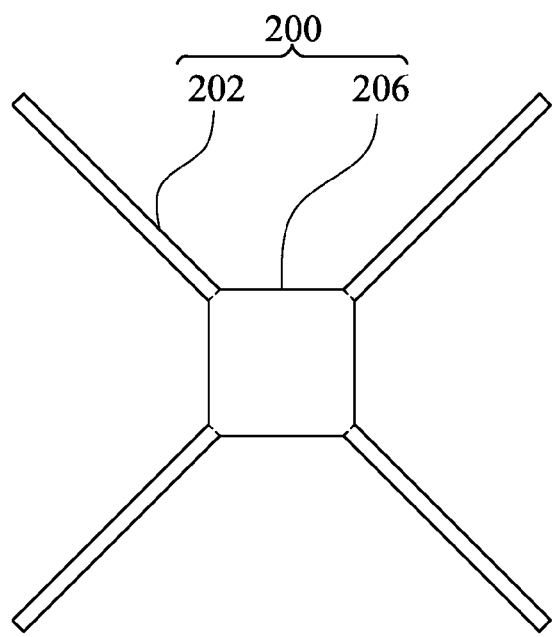
Figure 3C:
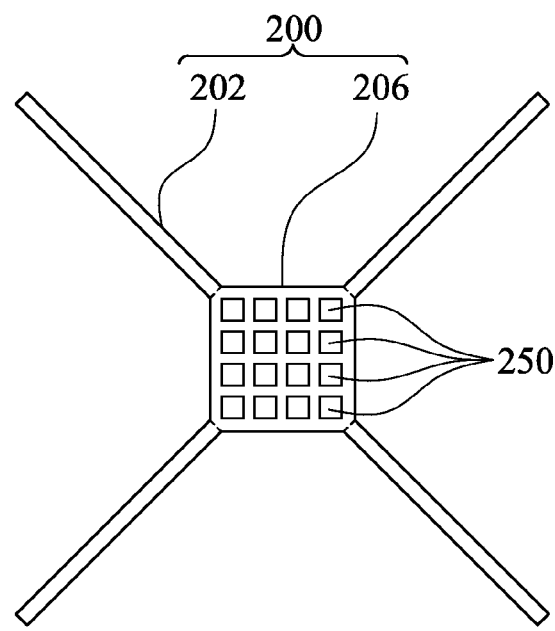
Figure 3D:
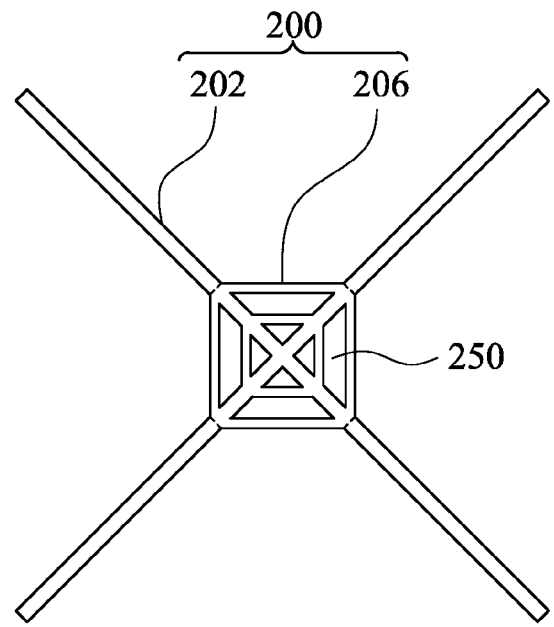
Figure 3E:
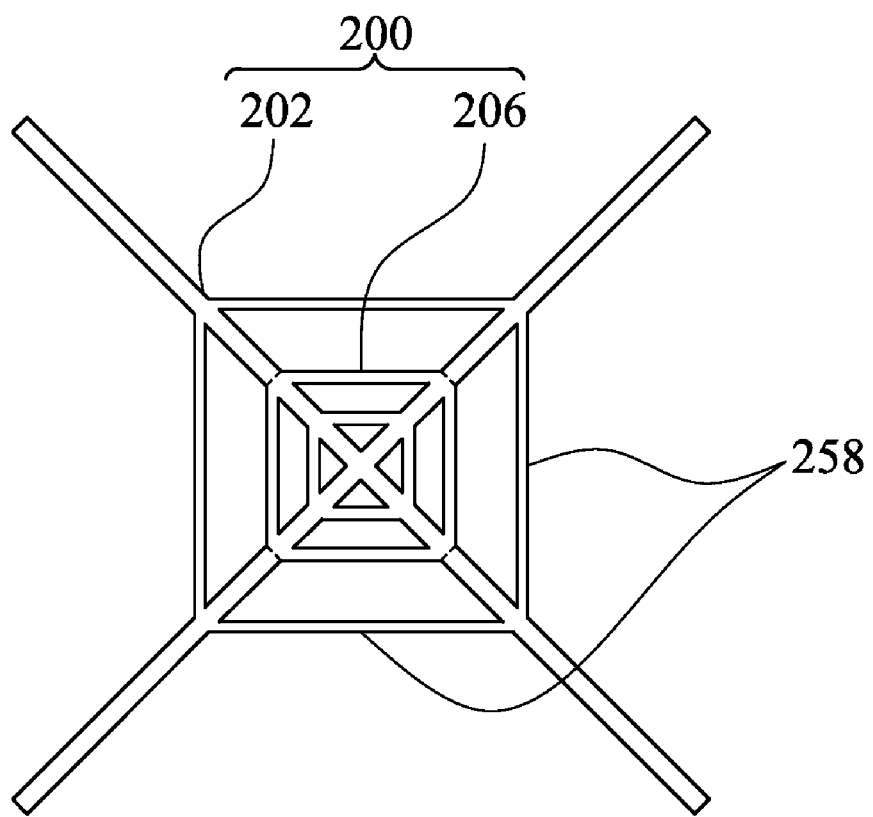

FIGS. 3a to 3e are lead frames showing various designs of the chip carrier 206 of lead frame 200 to optimized adhesive strength among semiconductor chip 208, chip carrier 206 and the package substrate 218. As shown in FIG. 3a, chip carrier 206 may be an intersection area of the supporting bonds 202. Chip carrier 206 may have a square shape as shown in FIG. 3b. In some embodiments of the invention, chip carrier 206 may have holes 250 formed inside of the chip carrier 206 as show in FIGS. 3c to 3e. Alternatively, additional supporting bonds 258 may be formed outside of the chip carrier 206, connected to supporting bonds 202, to improve adhesive strength between the chip carrier 206 and the package substrate 218. The holes 250 may have various kinds of shapes, for example, square, ladder, circle or the like, which are dependent upon design requirements, and is not limited.

Figure 4A:
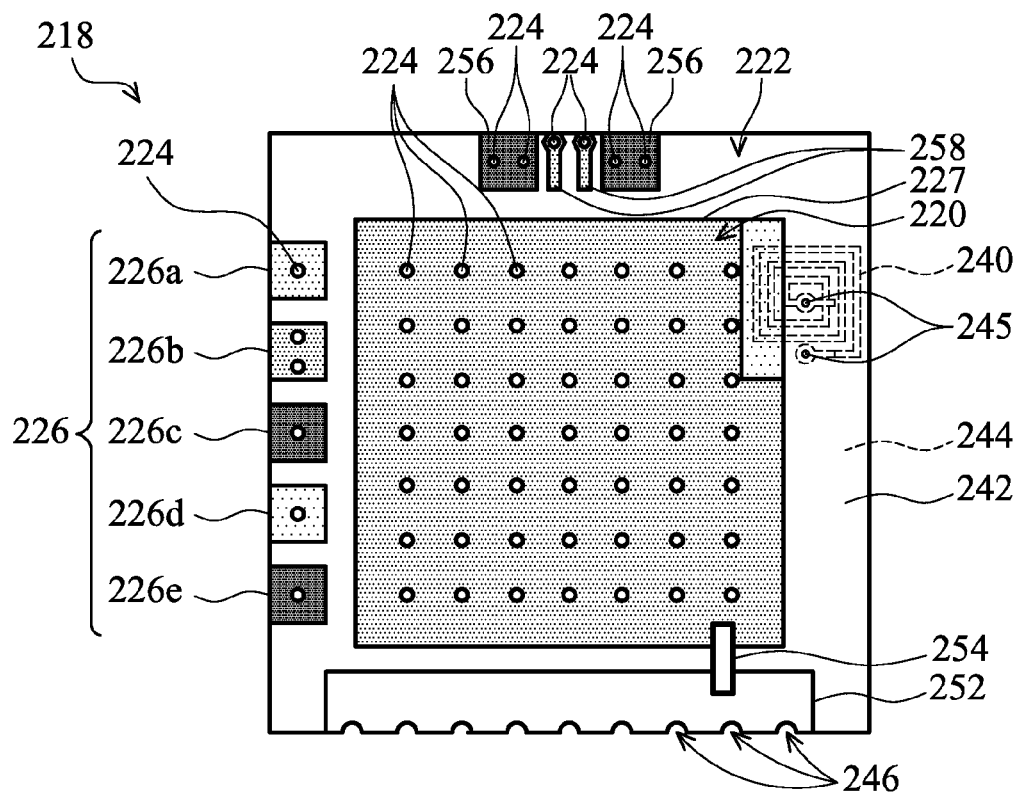
FIG. 4a shows a top view of one exemplary embodiment of a substrate of a semiconductor chip package of the invention.
Figure 4B:
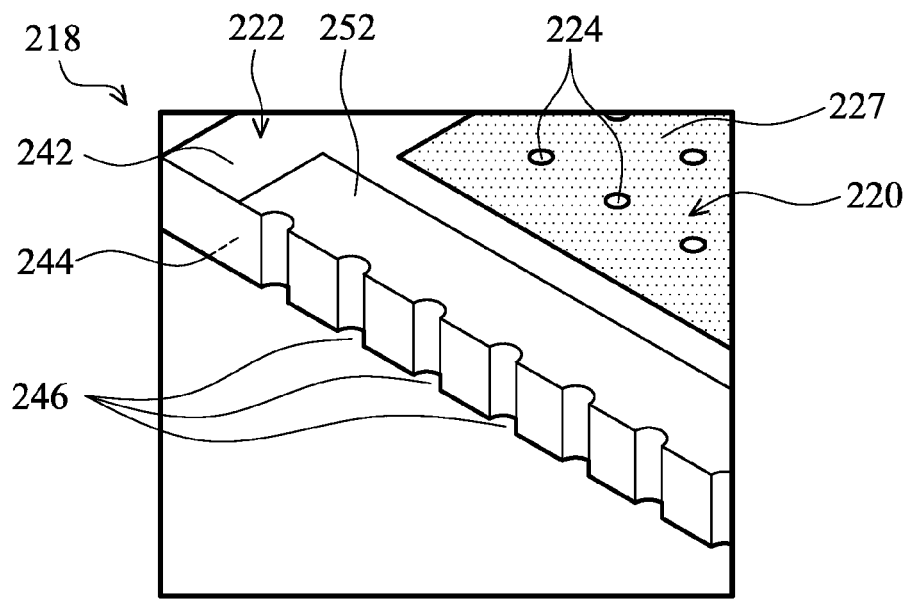

FIGS. 4a and 4b show one exemplary embodiment of a package substrate 218 design of a semiconductor chip package of the invention. The package substrate 218 not only provides amount of input/output connections of the semiconductor chip 208, but also serves as a heat sink for the semiconductor chip 208. The package substrate 218 may comprise a central region 220 and a marginal region 222. The central region 220 on the top surface 242 of the package substrate 218 is attached to and electrically connected to the second surface 234 of the chip carrier 206, having a conductive plane 227 thereon. In one embodiment of the invention, the central region 220 of the package substrate 218 may provide ground paths of the semiconductor chip 208, such as, ground paths of digital circuits. Also, the vias 224 in the central region 220 may be used to reduce thermal resistance. Also, a plurality of conductive planes 226, 252, 256 and 258 may be disposed on the top surface 242 in the marginal region 222 of the package substrate 218, electrically connecting to some bonding pads 210 of the semiconductor chip 208 as shown in FIG. 1a, respectively. In one embodiment of the invention, the conductive planes 226 and 252 may provide multiple power and/or ground paths of the semiconductor chip 208, such as, power and/or ground paths of analog circuits. A plurality of vias 224 is drilled through the package substrate 218, wherein some of vias 224 are electrically connected to the conductive planes 226, 227, 256 and 258. Each of conductive planes 226, 227, 256 and 258 may be electrically connected to a corresponding ball pad 228 (of FIG. 1b) on the bottom surface 244 through the vias 224, respectively.

Additionally, conductive planes 256 and 258 of the package substrate 218 may provide device interface connections for transmitting data, for example, universal serial bus (USB), high definition multimedia interface (HDMI), serial advanced technology attachment (SATA) or the like. As shown in FIG. 4a, the conductive planes 256 and 258 in the marginal region 222 may serve differential net planes and impedance control planes of device interfaces, respectively. Compared with the conventional lead frame based semiconductor package, length of the bonding wires for input/output connections of the semiconductor chip 208 can be reduced to have better electrical performances, such as, reduced resistance and inductance.

Further, a plurality of electrical components 240 and 254 may be disposed on the package substrate 218, electrically connecting to some of the bonding pads 210 through the bonding wires 212b and vias 224 as shown in FIGS. 1a and 1b. The aforementioned electrical components 240 and 254 may comprise passive components comprising power rings, ground rings, capacitors, resistors or inductors. For example, the electrical component 240, may serve as a spiral inductor trace, and be disposed on the bottom surface 244 of the package substrate 218, electrically connecting the bonding pads 210 through the vias 245 and bonding wires 212b as shown in FIGS. 1a and 1b. As the inductor 240 normally cannot be seen from a top view, the inductor 240 is profiled by dashed lines in FIG. 4a. Additionally, electrical component 254, may serve as a de-coupling capacitor, and may be disposed on the top surface 242 between a ground plane and a power plane, for example, conductive planes 227 and 252. The de-coupling capacitor 254 may be used to reduce noise generated by circuits. Compared with a conventional lead frame based semiconductor package, the package substrate 218 may provide additional electrical connections for the semiconductor chip 208, for example, power and/or ground paths. The package substrate 218 may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, package substrate 218 may have simple layout, for example, large power and ground planes without fine pitch traces. Therefore, fabricating cost can be reduced and yield can be improved.

FIG. 4b illustrates an enlarged view of a portion of FIG. 4a. In one embodiment of the invention, the recesses 246 may be designed at an edge of the package substrate 218, through the package substrate 218. The recesses 246 may be formed by firstly drilling holes (not shown) in the package substrate 218, and then sawing package substrate 218 through the holes. The recesses 246 may be positioned in conductive plane 252 as shown in FIG. 4b. The recesses 246 may provide additional electrical connection paths to the top surface 242 and bottom surface 244. Also, the recesses 246 may increase surface roughness of the package substrate 218. Therefore, bonding strength between the covering material 230 and the resulting package substrate 218 can be improved.

Figure 5A:
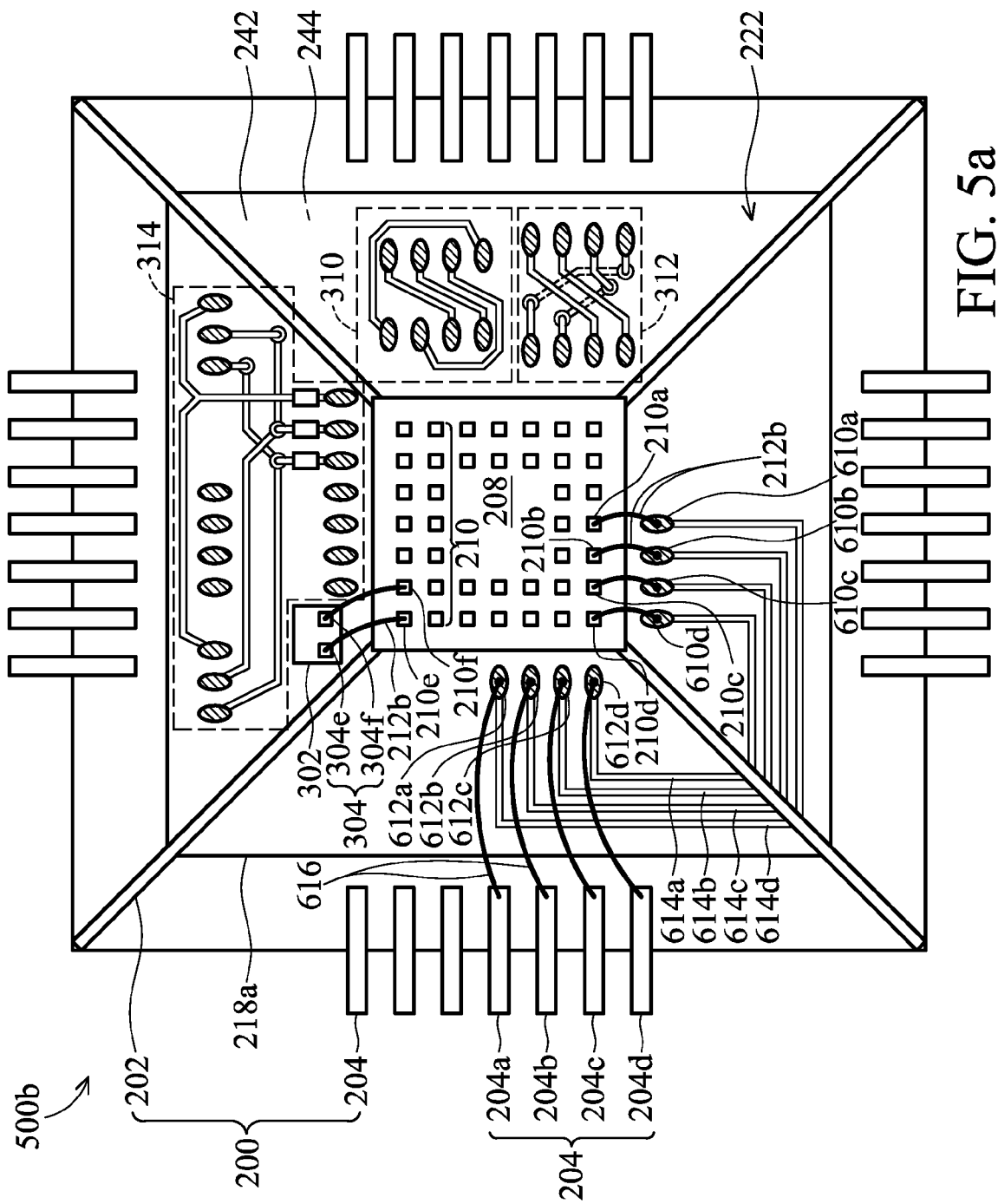
FIG. 5a shows a top view of another exemplary embodiment of a semiconductor chip package of the invention showing a package substrate design.
Figure 5C:
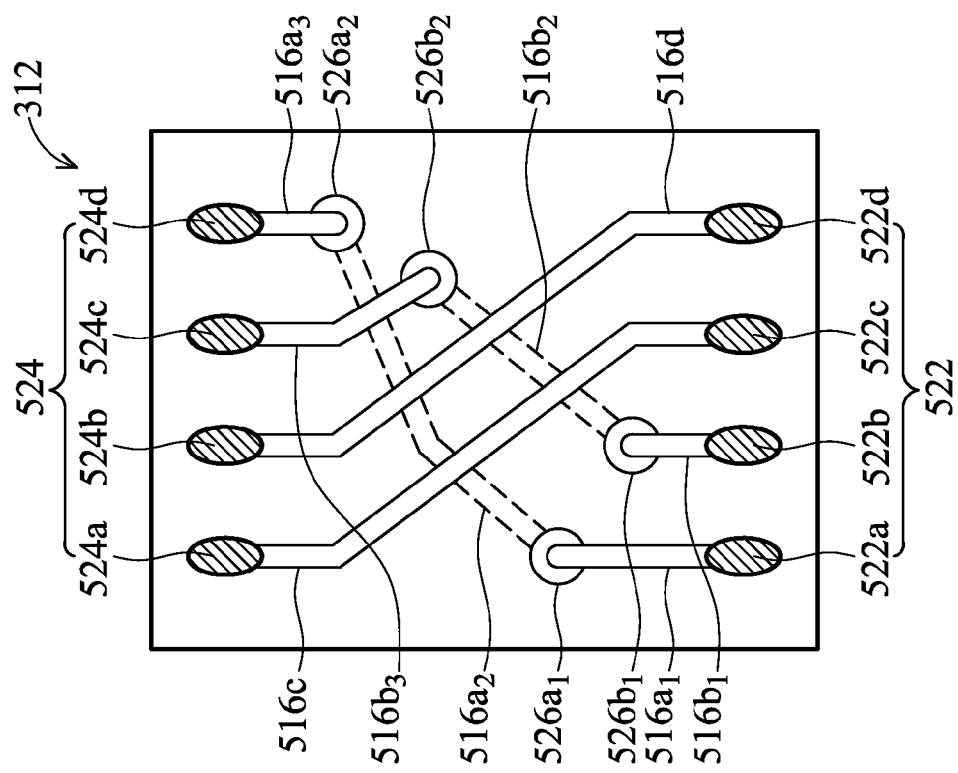
Figure 5B:
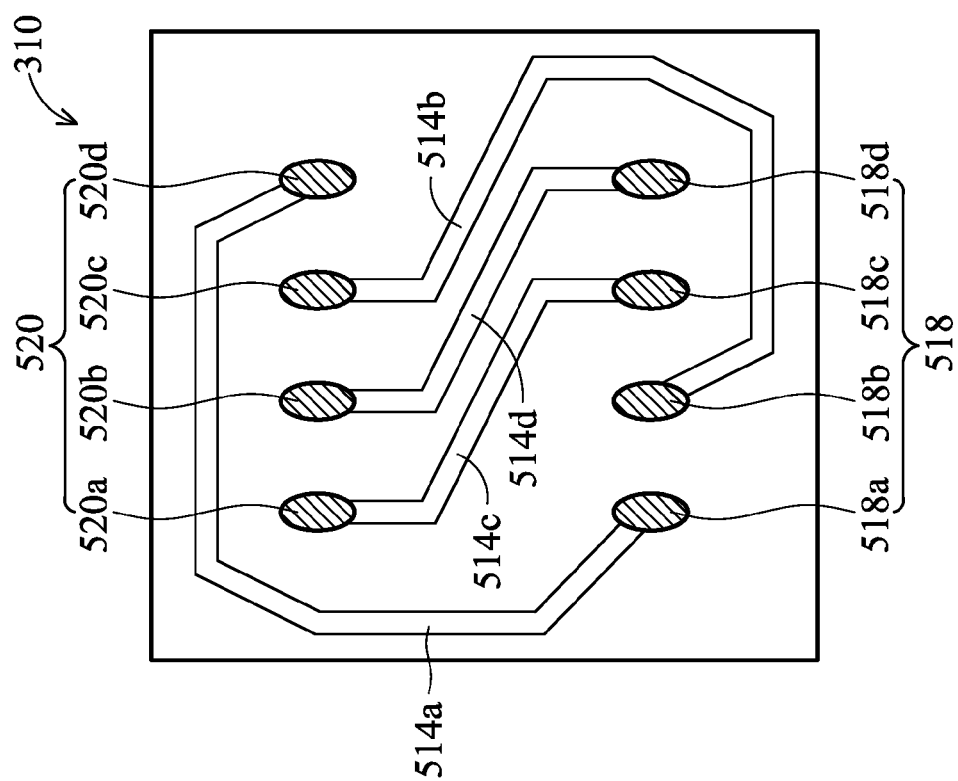

For the conventional lead frame based semiconductor package, the pin assignment allowed for each lead in a design rule is fixed. However, the lead frame based semiconductor chip package, which combines a package substrate with desirable signal trace routing designs of the invention, may achieve signal swapping without using a costly ball grid array semiconductor package. FIG. 5a shows a top view of another exemplary embodiment of a semiconductor chip package 500b of the invention showing a package substrate 218a design. In one embodiment, a plurality of fingers and corresponding conductive traces may be disposed on the top surface 242 in the marginal region 222 of the package substrate 218a. The fingers and the corresponding conductive traces may provide desirable signal trace routing between the bonding pads and the leads. FIG. 5b is an enlarged view of a portion 310 of FIG. 5a. As shown in FIG. 5a and FIG. 5b, in one embodiment, the package substrate 218a may comprise a plurality of fingers 518 and 520 on the top surface 242 in the marginal region 222 for signal swapping. The fingers 518 and 520 are arranged in an array with two rows, comprising inner fingers 518a to 518d and outer fingers 520a to 520d, wherein the inner fingers 518a to 518d are arranged along one row adjacent to the bonding pads 210 of the semiconductor chip 208, and the outer fingers 520a to 520d are arranged along another row adjacent to an edge of the package substrate 218a. In one embodiment, the inner fingers 518a to 518d are used to electrically connect to the bonding pads 210 of the semiconductor chip 208, and the outer fingers 520a to 520d are be used to electrically connect to the leads 204. For signal swapping between the bonding pad adjacent to the inner finger 514a and the lead adjacent to the outer finger 520a, a conductive trace 514a is disposed on the top surface 242 in the marginal region 222, electrically connected to the inner finger 518a and outer finger 520d, wherein a routing direction of the conductive trace 514a is substantially along an outer edge of the array. Therefore, the conductive trace 514a may not cross the conductive trace 514c/514d, which is electrically connected between the inner finger 518c/518d and the outer finger 520a/520b respectively. Similarly, the conductive trace 514b, which is electrically connected to the inner finger 518b and outer finger 520c, with a routing direction substantially along an outer edge of the array may not cross the conductive trace 514c/514d electrically connected between the inner finger 518c/518d and the outer finger 520a/520b respectively.

Alternatively, signal swapping may be achieved by a package substrate with conductive traces on the bottom surface 244 of the package substrate. FIG. 5c is an enlarged view of a portion 312 of FIG. 5a. As shown in FIG. 5a and FIG. 5c, in one embodiment, the package substrate 218a may comprise a plurality of fingers 522 and 524 on the top surface 242 in the marginal region 222 for signal swapping. The fingers 522 and 524 are arranged in an array with two rows, comprising inner fingers 522a to 522d and outer fingers 524a to 524d respectively, wherein the inner fingers 522a to 522d are arranged along one row adjacent to the bonding pads 210 of the semiconductor chip 208, and the outer fingers 524a to 524d are arranged along another row adjacent to an edge of the package substrate 218a. In one embodiment, the inner fingers 522a to 522d are used to electrically connect to the bonding pads 210 of the semiconductor chip 208, and the outer fingers 524a to 524d are used to electrically connect to the leads 204. For signal swapping between the bonding pad adjacent to the inner finger 522a and the lead adjacent to the outer finger 524a, a conductive trace $516a_2$ may be disposed on the bottom surface 244 in the marginal region 222. The conductive trace $516a_2$ is electrically connected to the inner finger 522a through a via plug $526a_1$ drilled through the package substrate 218a and the conductive trace $516a_1$ on the top surface 242. Also, the conductive trace $516a_2$ may be electrically connected to the outer finger 524d through a via plug $526a_2$ drilled through the package substrate 218a and the conductive trace $516a_3$ on the top surface 242. Therefore, the conductive trace $516a_2$ may not cross the conductive traces 516c/516d, which are electrically connected between the inner finger $522c/522d$ and the outer finger $524a/524b$ respectively. Similarly, the conductive trace $516b_2$, which is disposed on the bottom surface 244 in the marginal region 222 and electrically connected to the inner finger $522b$ and the outer finger $524c$ through via plugs $526b_1$ and $526b_2$, and conductive traces $516b_1$ and $516b_3$, may not cross the conductive trace $516c/516d$ electrically connected between the inner finger $522c/522d$ and the outer finger $524a/524b$.

Figure 5D:
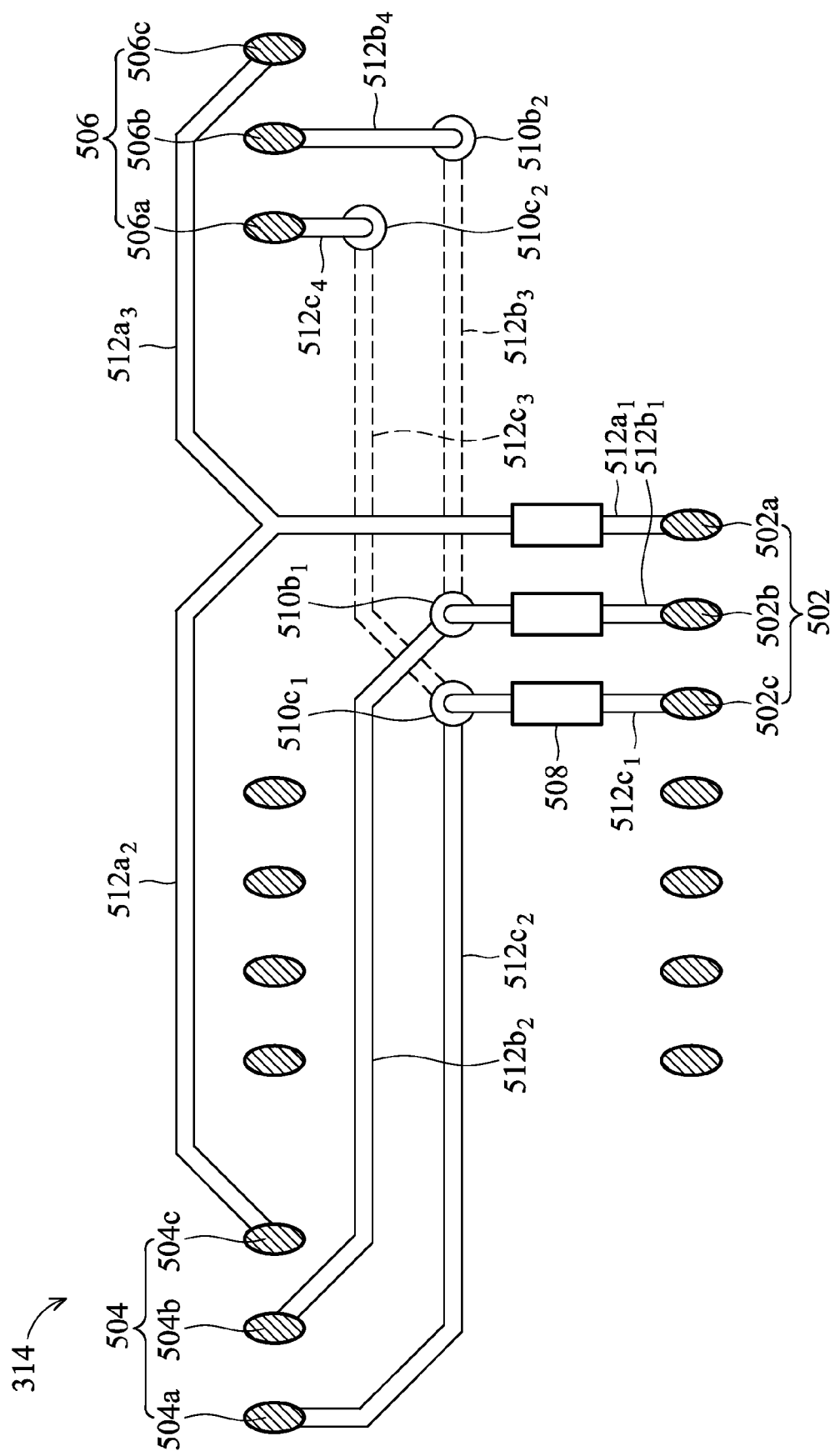

Alternatively, signal dividing from one bonding pad into isolated leads may be achieved by a package substrate having conductive traces with branches of the invention. FIG. 5d is an enlarged view of a portion 314 of FIG. 5a. As shown in FIG. 5a and FIG. 5d, in one embodiment, the package substrate 218a may comprise a plurality of fingers 502, 504 and 506. The fingers 502 are disposed adjacent to the bonding pads 210 of the semiconductor chip 208. The fingers 504 and 506 are disposed adjacent to an edge of the package substrate 218a. For signal dividing from the bonding pad adjacent to the finger 502a into two isolated leads adjacent to the fingers 504c and 506c, a conductive trace $512a_1$ having two branches $512a_2$ and $512a_3$ may be disposed on the top surface 242 in the marginal region 222, electrically connected to the finger 502a, wherein the two branches $512a_2$ and $512a_3$ are respectively electrically connected to the fingers 504c and 506c, thereby allowing the finger 502a to be electrically connected to the fingers 504c and 506c at the same time. A resistor 508 provided as a damping element may be coupled to the conductive trace $512a_1$. Alternatively, the branches of the conductive trace may not be coplanar. As shown in FIG. 5d, for signal dividing from the bonding pad adjacent to the finger 502b into two isolated leads adjacent to the fingers 504b and 506b, a conductive trace $512b_1$ having two branches $512b_2$ and $512b_3$ may be electrically connected to the fingers 502b, 504b and 506b at the same time, wherein the two branches $512b_2$ and $512b_3$ are respectively on the top surface 242 and the bottom surface 244. The branch $512b_3$ is electrically connected to the branch $512b_2$ through a via plug $510b_1$ drilled through the package substrate 218a. Also, the branch $512b_3$ is electrically connected to the finger 506b through a via plug $510b_2$ and a conductive trace $512b_4$, which is on the top surface 242. Similarly, a conductive trace $512c_1$, having branches $512c_2$ and $512c_3$, may provide a signal dividing path from the bonding pad adjacent to the finger 502c into the leads adjacent to the fingers 504a and 506a, wherein the branch $512c_3$ is electrically connected to the branch $512c_2$ and the finger 506a on the top surface 242 by via plugs $510c_1$, $510c_2$ and another conductive trace $512c_4$.

Figure 5E:
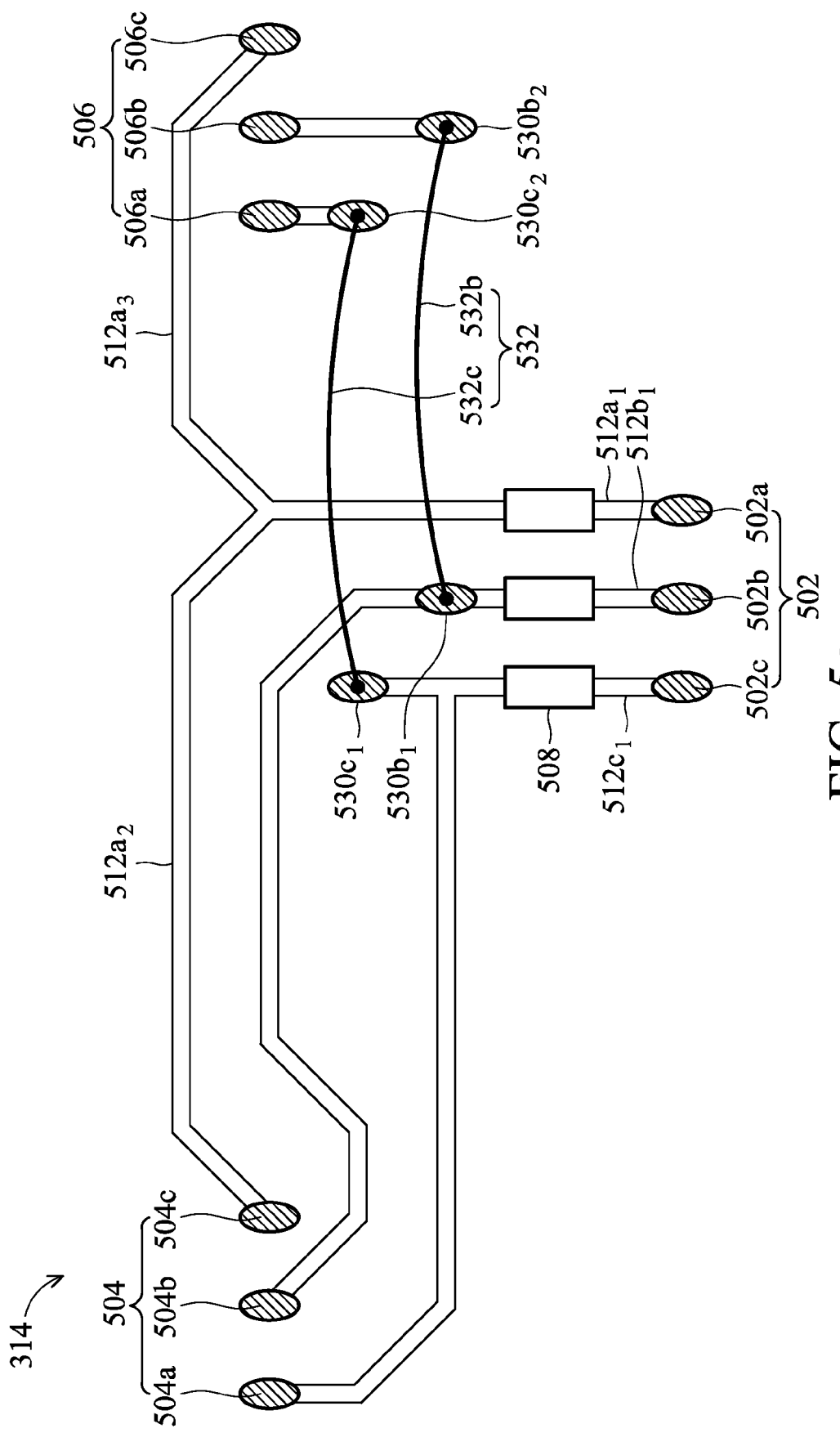

Moreover, signal dividing from one binding pad into isolated leads may also be achieved by a package substrate having conductive traces and switching bonding wires of the invention. FIG. 5e is an enlarged view of a portion 314 of FIG. 5a showing a package substrate design with switching bonding wires 532. As shown in FIG. 5a and FIG. 5e, in one embodiment, the conductive trace $512b_1$ and a switching bonding wire 532b may provide a signal dividing path from the bonding pad adjacent to the finger 502b into the leads adjacent to the fingers 504b and 506b. The switching bonding wire 532b is respectively electrically connected to the conductive trace $512b_1$ and finger 506b through the connecting fingers $530b_1$ and $530b_2$. Similarly, the conductive trace $512c_1$ and a switching bonding wire 532c may provide a signal dividing path from the bonding pad adjacent to the finger 502c into the leads adjacent to the fingers 504a and 506a. The switching bonding wire 532c is respectively electrically connected to the conductive trace $512c_1$ and finger 506a through the connecting fingers $530c_1$ and $530c_2$. As shown in FIG. 5e, the switching bonding wire 532b is across the conductive trace $512a_1$ on the top surface 242 without electrically connecting to the conductive trace $512a_1$. Also, the switching bonding wire 532c is across the conductive traces $512a_1$ and $512b_1$ on the top surface 242 without electrically connecting to the conductive traces $512a_1$ and $512b_1$.

Figure 5F:
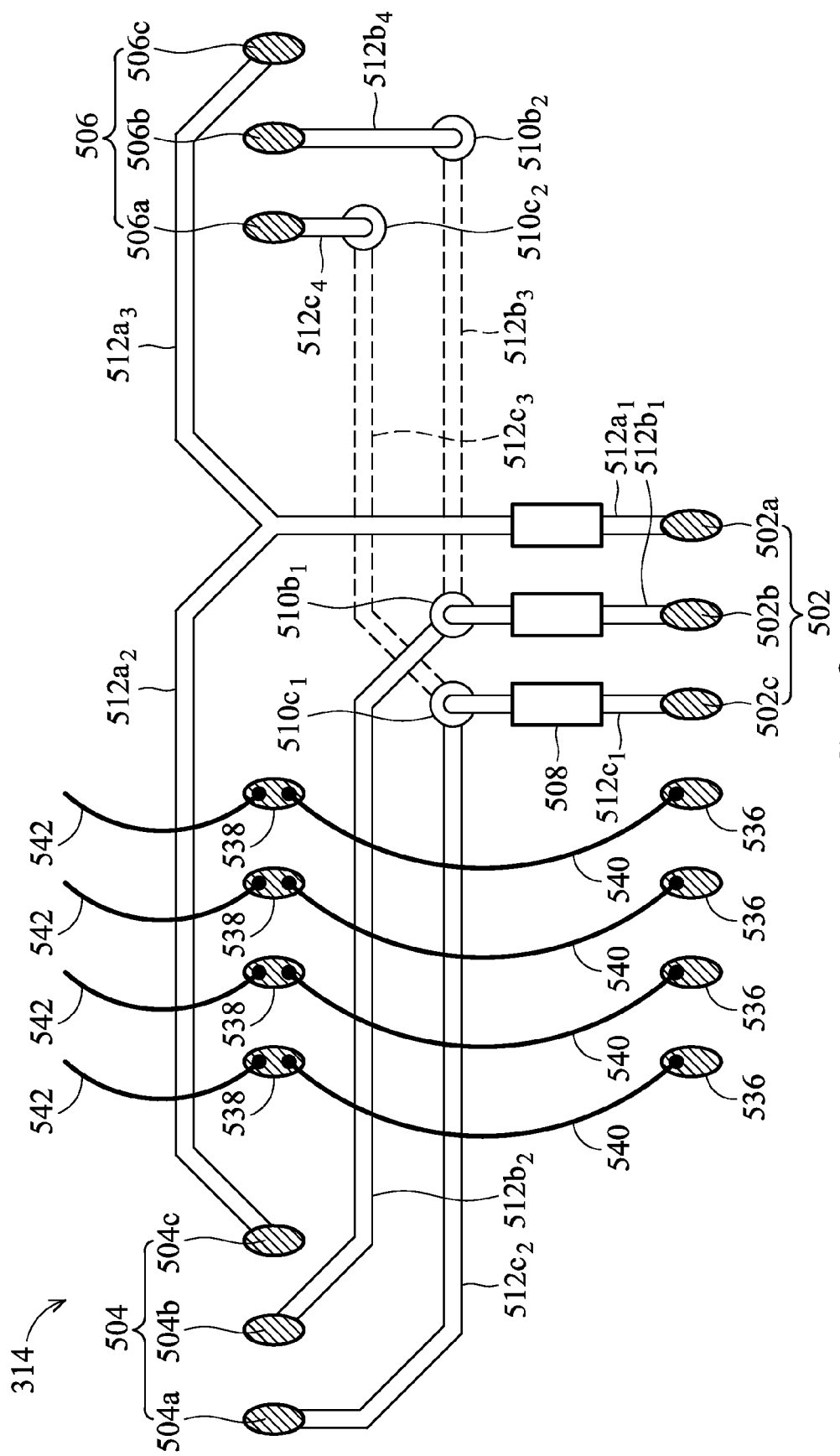

For the conventional lead frame based semiconductor chip package, as the semiconductor chip is scaled down in size, a bonding problem due to bonding wire length limitations occurs. The aforementioned problem can be solved with a fine pitch leadframe to reduce a bonding distance between the bonding pads and the leads. The fine pitch leadframe, however, results in high fabrication cost and low yield. FIG. 5f is an enlarged view of a portion 314 of FIG. 5a showing a package substrate design to solve the bonding wire length limitation problem. As shown in FIG. 5a and FIG. 5f, fingers 536 and 538 are arranged in a two-row array on the top surface 242 in the marginal region 222, wherein the fingers 536 are disposed adjacent to the semiconductor chip 208, and the fingers 538 are disposed adjacent to an edge of the package substrate 218a. The fingers 536 may be electrically connected to the bonding pads (not shown), the bonding wires 540 may be disposed, electrically connecting between the fingers 536 and 538, and the bonding wires 542, electrically connecting to the fingers 538 may be used to connect the leads. The bonding distance between the bonding pads and the leads may be reduced by multiple wirebondings provided by the package substrate 218a comprising fingers 536 and 538 and the bonding wires 540 and 542.

Signal routing from the bonding pad to the lead, which are respectively adjacent to different sides of the semiconductor chip, may be achieved by a package substrate with fingers and conductive traces of the invention. As shown in FIG. 5a, fingers 610a to 610d and 612a to 612d are disposed on the top surface 242 in the marginal region 222. The fingers 610a to 610d respectively adjacent to the bonding pads 210a to 210d are electrically connected to the bonding pads 210a to 210d through the bonding wires 212b. The fingers 612a to 612d respectively adjacent to the leads 204a to 204d are electrically connected to the leads 204a to 204d through the bonding wires 616. A plurality of conductive traces 614a to 614d may be disposed on the top surface 242, wherein the conductive traces 614a to 614d are electrically connected between the fingers 610a to 610d and the fingers 612a to 612d, respectively. Therefore, the signal from the bonding pad may be transmitted to the lead, which is on a different side from the bonding pad, through the conductive trace on the package substrate. For example, the signal from the bonding pad 210a may be transmitted to the lead 204a, which is on a different side from the bonding pad 210a, through the conductive trace 614a and corresponding fingers 610a and 612a.

Additionally, other semiconductor chips, for example, electrically erasable programmable read-only memory chips (EEPROM) with bonding pads 304 thereon may be disposed on the package substrate 218a, which electrically connected to the semiconductor chip 208 through the bonding wires, for example, bonding wires 212b.

Figure 6A:
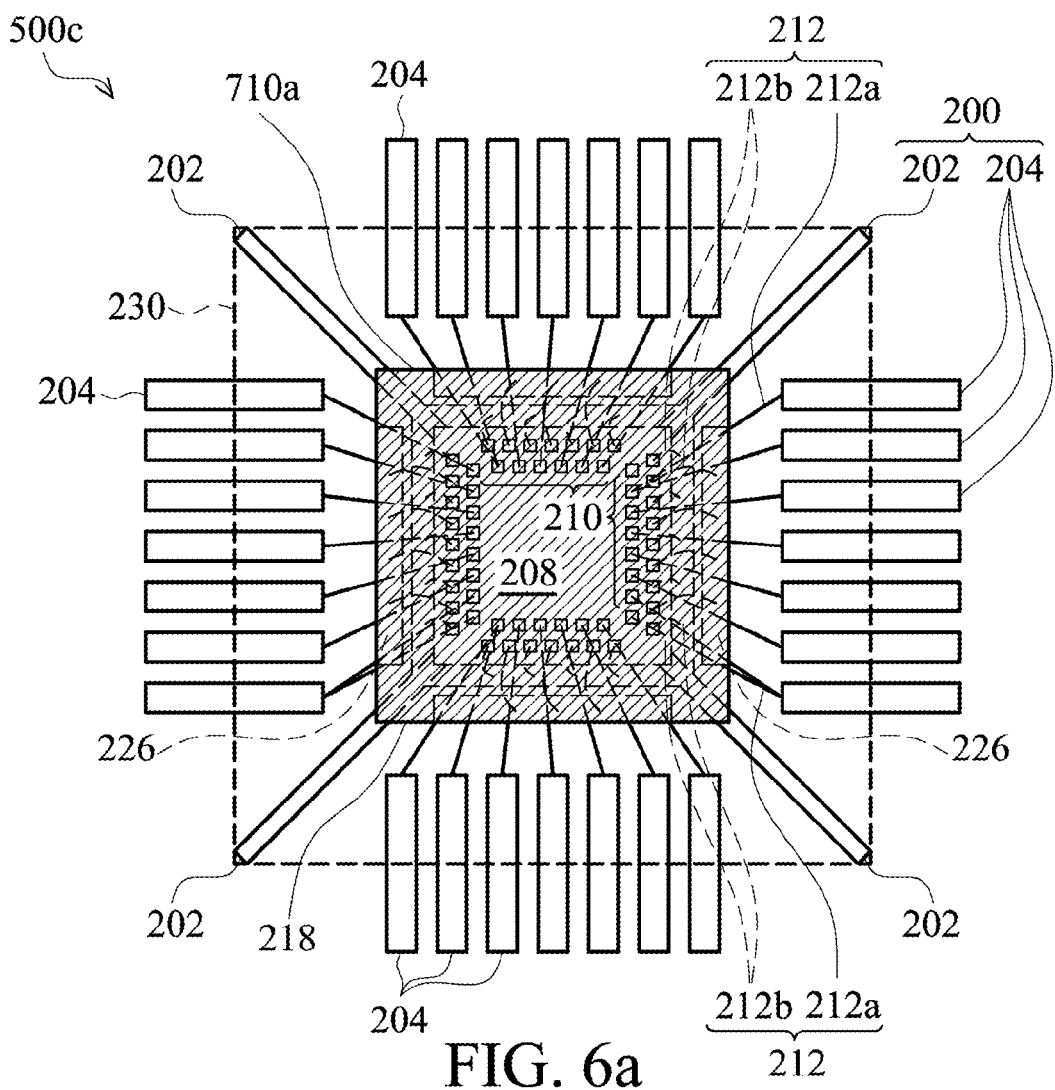
FIG. 6a shows a top view of another exemplary embodiment of a semiconductor chip package of the invention.
Figure 6B:
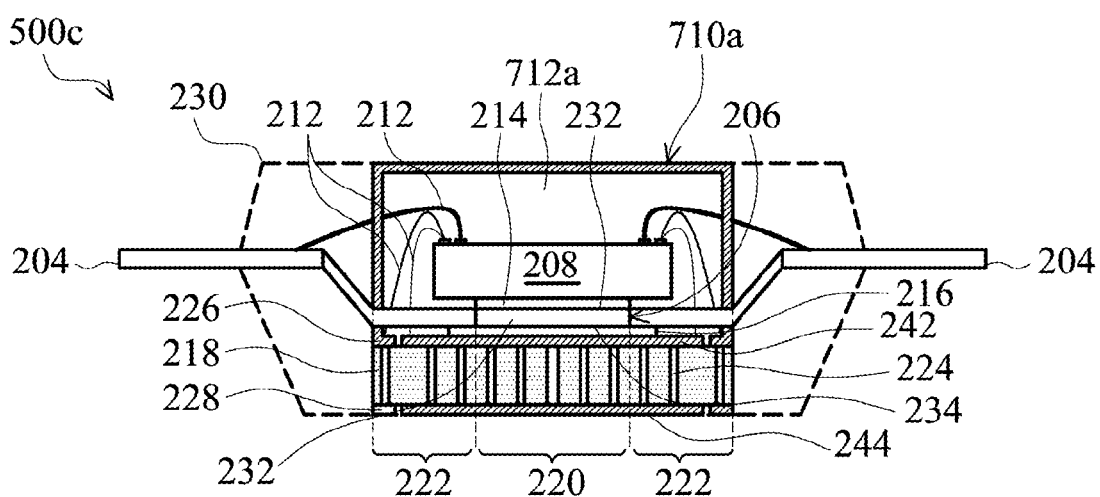
FIG. 6b shows a cross section of another exemplary embodiment of a semiconductor chip package of the invention.
Figure 7A:
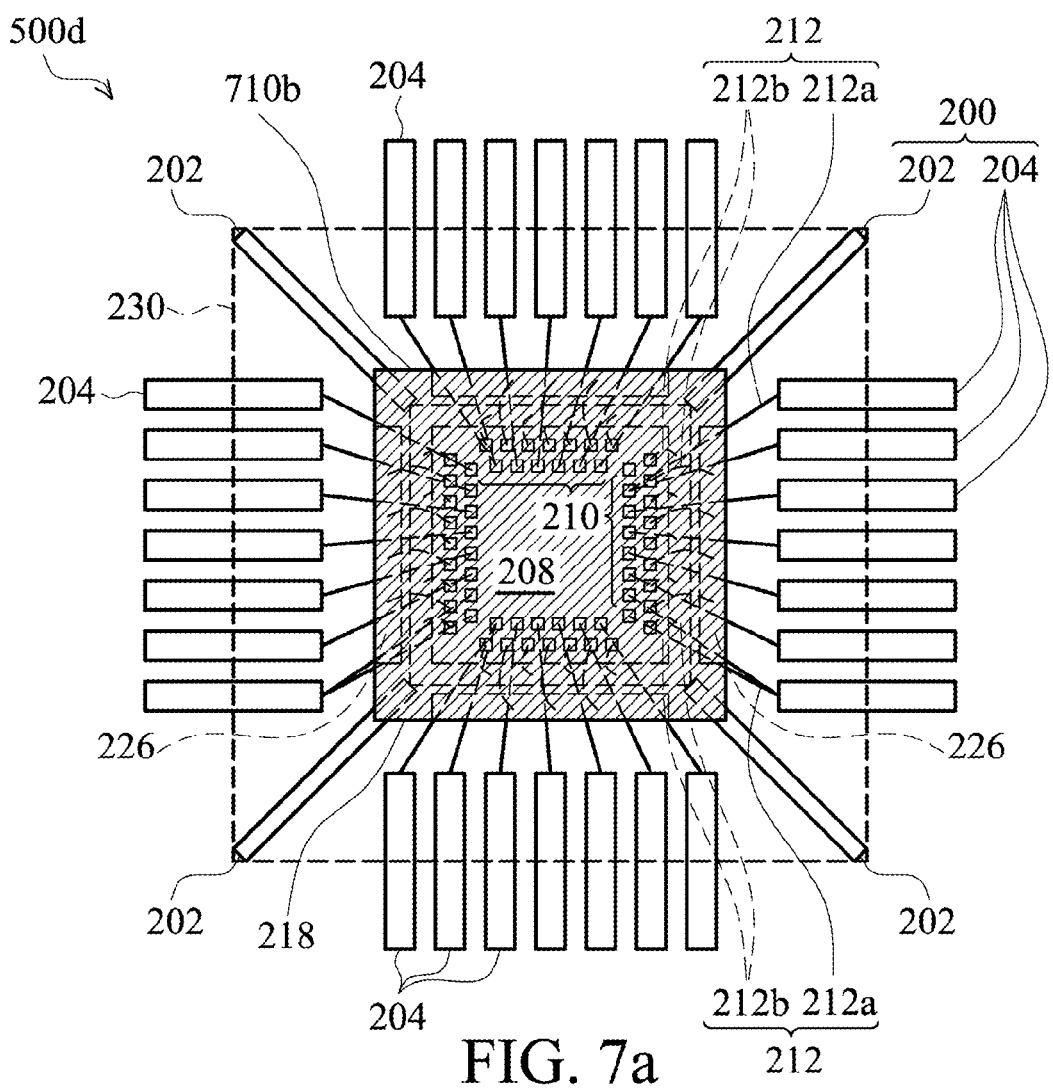
FIG. 7a shows a top view of another exemplary embodiment of a semiconductor chip package of the invention.
Figure 7B:
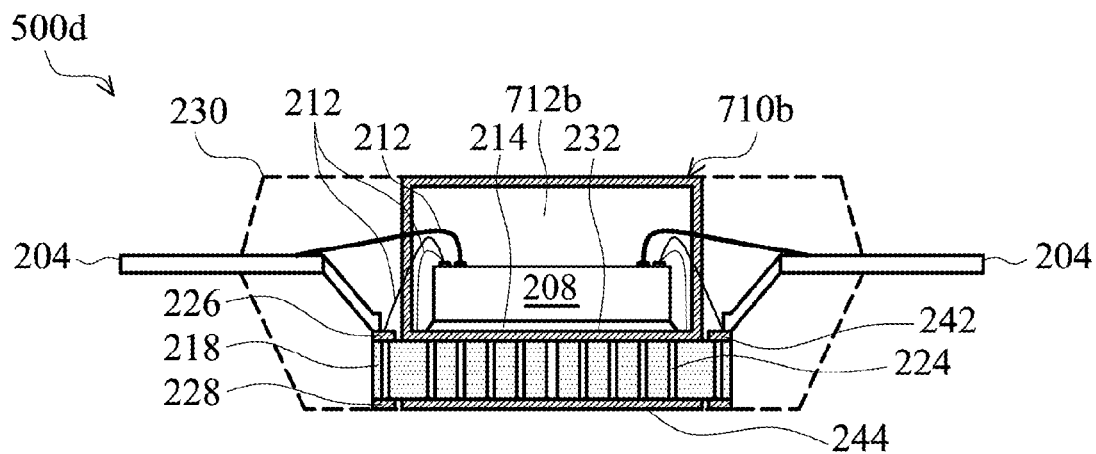
FIG. 7b shows a cross section of another exemplary embodiment of a semiconductor chip package of the invention.

FIG. 6a to FIG. 7b are other exemplary embodiments of a semiconductor chip packages 500c and 500d of the invention showing a semiconductor chip package with a heat sink. As shown in FIG. 6a and FIG. 6b, for heat dissipation efficiency improvement, a heat sink 710a may be mounted on the top surface 242 of the package substrate 218, having a cavity 712a to accommodate the semiconductor chip 208, an inner portion of the lead frame 200 and a portion of the package substrate 218 therein. Alternatively, as shown in FIG. 7a and FIG. 7b, a heat sink 710b may be mounted on the top surface 242 of the package substrate 218 with the semiconductor chip 208 and the supporting bonds 202 directly mounted thereon without the chip carrier. The heat sink 710b has a cavity 712b to accommodate the semiconductor chip 208 and a portion of the package substrate 218 therein.

Figure 8:
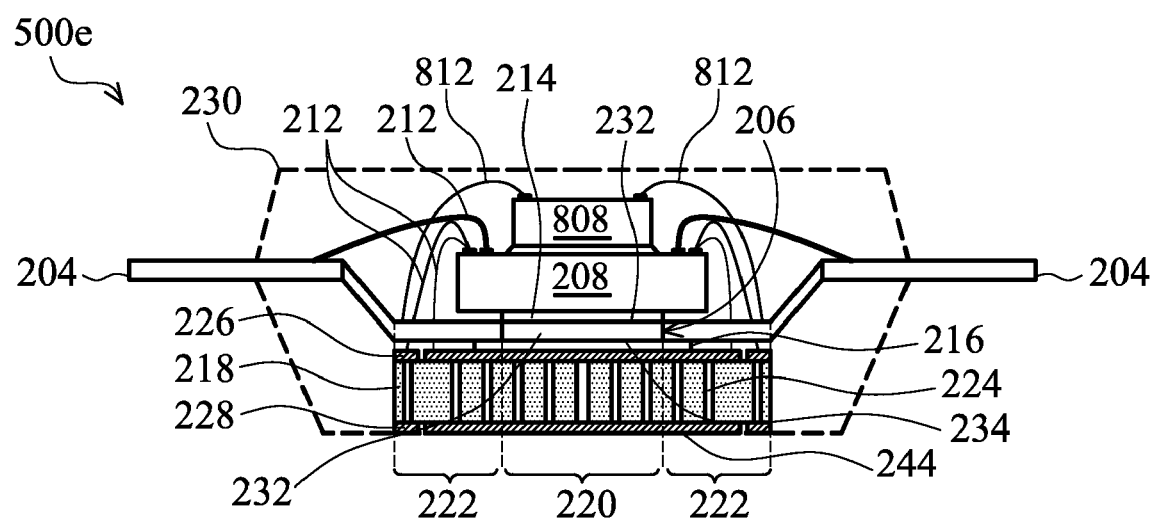
FIG. 8 is a cross section of another exemplary embodiment of a semiconductor chip package of the invention showing a stack-die semiconductor chip package.

FIG. 8 is a cross section of another exemplary embodiment of a semiconductor chip package 500e of the invention showing a stack-die semiconductor chip package. Another semiconductor chip 808 may be stacked on the semiconductor chip 208 and electrically connected to the package substrate 218 through the bonding wires 812.

Figure 9A:
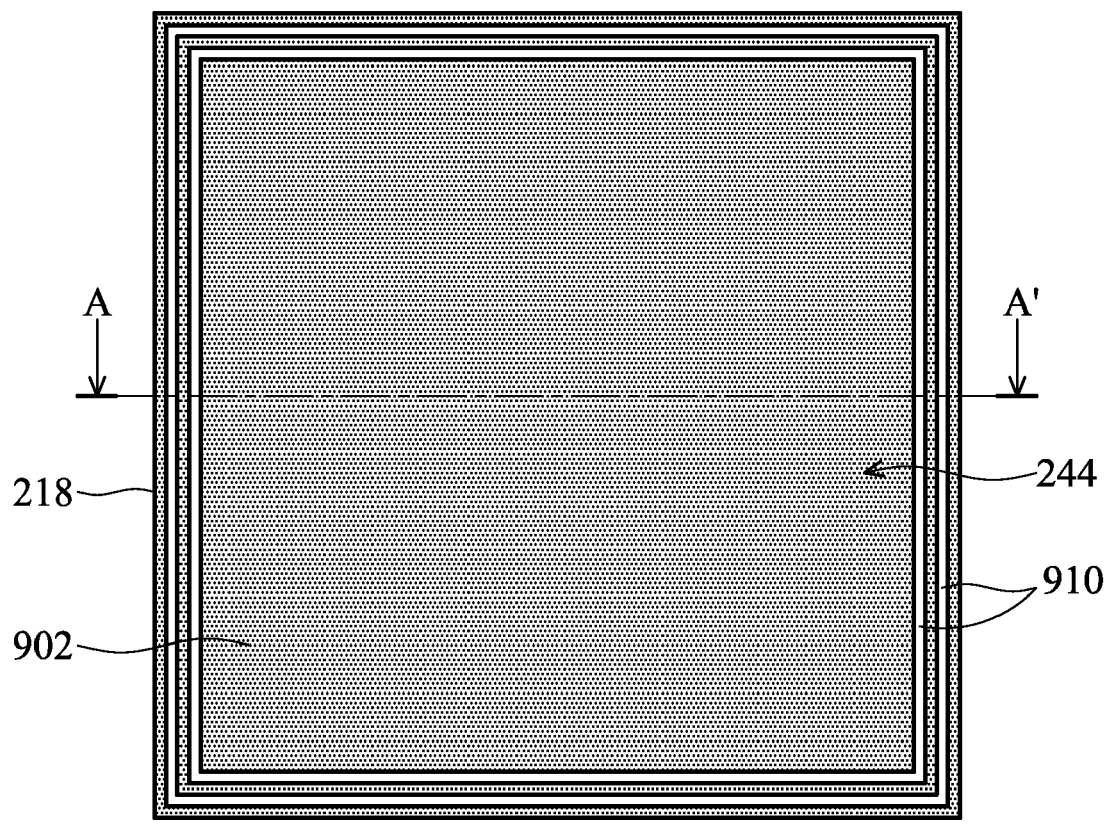
FIG. 9a shows a bottom view of one exemplary embodiment of a substrate of a semiconductor chip package of the invention.
Figure 9B:
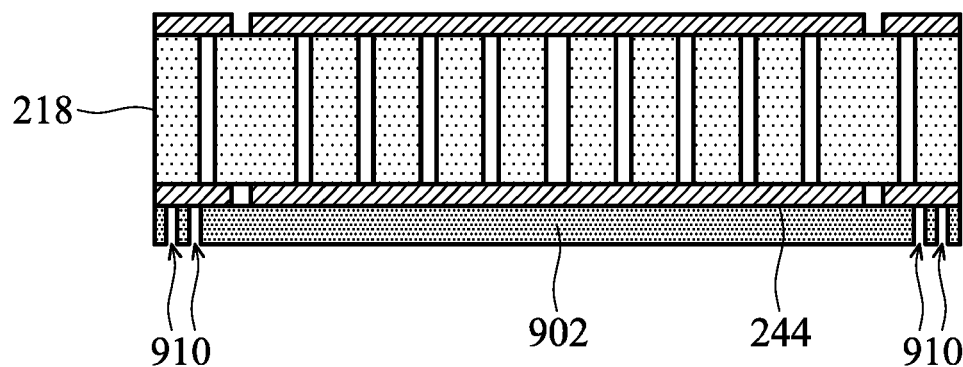

FIG. 9a and FIG. 9b show one exemplary embodiment of a package substrate 218 of a semiconductor chip package of the invention. The package substrate 218 may further comprise a solder mask layer 902 on the bottom surface 244 of the package substrate 218, wherein the solder mask layer 902 comprises grooves 910 substantially along an edge of the package substrate 218, thereby preventing bleeding out of a mold resin used for encapsulating the semiconductor chip package.

Figure 10:
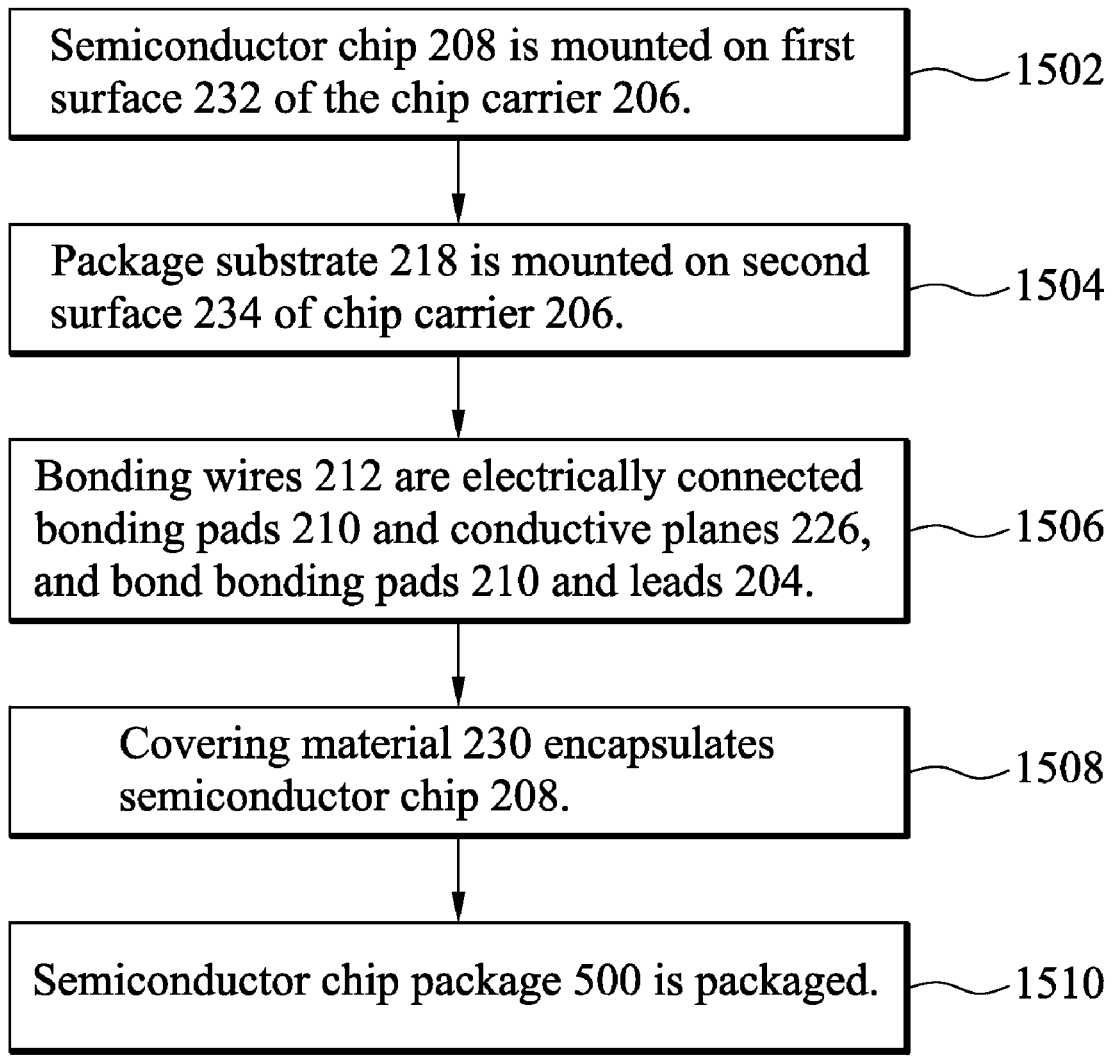
FIG. 10 is a flow diagram showing a fabricating process for assembly of a semiconductor chip package of the invention.

FIG. 10 is a flow diagram showing a fabricating process for assembly of a semiconductor chip package 500 of the invention. As shown in step 1502, the step of assembly of a semiconductor chip package 500 comprises mounting a semiconductor chip 208 on a first surface 232 of the chip carrier 206 by adhesive material 214. As shown in step 1504, the central region 220 of the package substrate 218 is mounted on the second surface 234 of the chip carrier 206 by an adhesive material 216, leaving the marginal region 222 exposed through the chip carrier 206. As shown in step 1506, some bonding wires 212 are electrically connected to the bonding pads 210 and conductive planes 226 in the marginal region 222 of the package substrate 218. The remaining bonding wires 212 bond the bonding pads 210 and leads 204. As shown in step 1508, the covering material 230 encapsulates the semiconductor chip 208, an inner portion of lead frame 200 and a portion of the package substrate 218 by molding, leaving the bottom surface 244 of the package substrate 218 exposed from the covering material 230. As shown in step 1510, the resulting semiconductor chip package 500 is packaged for product delivery.

The semiconductor chip package 500 is illustrated. Some advantages of an exemplary embodiment of the semiconductor chip package 500 of the invention are described in the following. The package substrate 218 not only serves as a heat sink for the semiconductor chip 208, but also provides amount of input/output connections of the semiconductor chip 208. Compared with the conventional lead frame based semiconductor package, the package substrate 218 may provide additional electrical connections for the semiconductor chip 208, for example, power and/or ground paths. The package substrate 218 may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, package substrate 218 may have simple layout. Therefore, fabricating cost can be reduced and yield can be improved. The vias 224 in the central region 220 may be used for reducing thermal resistance. The chip carrier 206 of the lead frame 200 may have various designs to optimized adhesive strength among the semiconductor chip 208, chip carrier 206 and the package substrate 218. Additionally, the package substrate of the semiconductor chip package 500 may have fingers, conductive traces or switching bonding wires thereon to provide additional signal routing paths for signal swapping and signal dividing. Also, the bonding distance between the bonding pads and the leads may be reduced by multiple wirebondings provided by the package substrate comprising fingers and the bonding wires, thereby reducing fabrication costs. Moreover, to improve heat dissipation efficiency, the semiconductor chip packages may further comprise a heat sink mounted on the top surface of the package substrate, having a cavity to accommodate the semiconductor chip, an inner portion of the lead frame and a portion of the package substrate therein. Alternatively, another semiconductor chip may be stacked on the semiconductor chip, electrically connected to the package substrate through the bonding wires to form a stack-die semiconductor chip package. Also, the package substrate may further comprise a solder mask layer comprising grooves substantially along an edge of the package substrate, thereby preventing bleeding of a mold resin used for encapsulating the semiconductor chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip package, comprising:
   a lead frame having a chip carrier, wherein the chip carrier has a first surface and an opposite second surface;
   a first semiconductor chip mounted on the first surface, having a plurality of bonding pads thereon, wherein the first semiconductor chip has an area larger that that of the chip carrier; and
   a package substrate having a central region attached to the second surface of the chip carrier, having an area larger than that of the first semiconductor chip, wherein the package substrate comprises a plurality of fingers on a top surface thereof in a marginal region of the package substrate, which are arranged in an array with a row of inner fingers adjacent to the first semiconductor chip and a row of outer fingers adjacent to an edge of the package substrate, wherein the inner fingers are electrically connected to the bonding pads of the first semiconductor chip, and the outer fingers are electrically connected to the lead frame.

2. The semiconductor chip package as claimed in claim 1, further comprising:
   a first conductive trace on the top surface in the marginal region, electrically connected to at least one of the inner fingers and at least one of the outer fingers, wherein a routing direction of the first conductive trace is substantially along an outer edge of the array; and
   a second conductive trace on the top surface in the marginal region, wherein the second conductive trace is electrically connected to at least another one of the inner fingers and at least another one of the outer fingers without crossing the first conductive trace.

3. The semiconductor chip package as claimed in claim 1, further comprising:
   a first conductive trace on the top surface in the marginal region, electrically connected to at least one of the inner fingers and at least one of the outer fingers; and
   a second conductive trace on a bottom surface of the package substrate in the marginal region, electrically connected to at least another one of the inner fingers and at least another one of the outer fingers through via plugs drilled through the package substrate.

4. The semiconductor chip package as claimed in claim 1, further comprising:
- a conductive trace having a first branch and a second branch on the top surface in the marginal region, electrically connected to one of the inner fingers, wherein the first and the second branches are respectively electrically connected to at least two of the outer fingers.

5. The semiconductor chip package as claimed in claim 4, wherein the first branch is on the top surface, the second branch is on the bottom surface, and the second branch is electrically connected to the first branch and one of the at least two outer fingers through via plugs drilled through the package substrate.

6. The semiconductor chip package as claimed in claim 1, further comprising:
- a first conductive trace on the top surface in the marginal region, electrically connected to at least one of the inner fingers and at least one of the outer fingers;
- a first connecting finger and a second connecting finger on the top surface in the marginal region, respectively electrically connected to first conductive trace and another one of the outer fingers; and
- a bonding wire electrically connected between the first connecting finger and the second connecting finger.

7. The semiconductor chip package as claimed in claim 6, wherein the bonding wire is across a second conductive trace on the top surface without electrically connecting to the second conductive trace.

8. The semiconductor chip package as claimed in claim 1, further comprising:
- a bonding wire electrically connected to at least one of the inner fingers and at least one of the outer fingers.

9. The semiconductor chip package as claimed in claim 8, wherein the bonding wire is across a conductive trace on the top surface without electrically connecting to the conductive trace.

10. The semiconductor chip package as claimed in claim 1, further comprising:
- a heat sink mounted on the top surface of the package substrate, having a cavity to accommodate the first semiconductor chip, an inner portion of the lead frame and a portion of the package substrate therein.

11. The semiconductor chip package as claimed in claim 1, further comprising:
- a second semiconductor chip mounted on the first semiconductor chip with electrically connected to the package substrate.

12. The semiconductor chip package as claimed in claim 1, further comprising a solder mask layer on the bottom surface of the package substrate, wherein the solder mask layer comprises a groove substantially along an edge of the package substrate.

* * * * *

UNITED STATES PATENT AND TRADEMARK OFFICE
CERTIFICATE OF CORRECTION

| | |
|---|---|
| PATENT NO. | : 7,834,436 B2 |
| APPLICATION NO. | : 12/266601 |
| DATED | : November 16, 2010 |
| INVENTOR(S) | : Chen |

It is certified that error appears in the above-identified patent and that said Letters Patent is hereby corrected as shown below:

Title Page; item (57);
In the abstract. The abstract for this patent should read:

A semiconductor chip package comprises a lead frame having a chip carrier having a first surface and an opposite second surface. A first semiconductor chip is mounted on the first surface, having a plurality of bonding pads thereon, wherein the first semiconductor chip has an area larger that that of the chip carrier. A package substrate has a central region attached to the second surface of the chip carrier, having an area larger than that of the first semiconductor chip, wherein the package substrate comprises a plurality of fingers on a top surface thereof in a marginal region of the package substrate, which are arranged in an array with a row of inner fingers adjacent to the first semiconductor chip and a row of outer fingers adjacent to an edge of the package substrate, wherein the inner and outer fingers are electrically connected to the bonding pads of the first semiconductor chip and the lead frame respectively.

Signed and Sealed this
Eleventh Day of January, 2011

David J. Kappos
*Director of the United States Patent and Trademark Office*